United States Patent
Lin et al.

(10) Patent No.: US 8,981,447 B2
(45) Date of Patent: Mar. 17, 2015

(54) LIGHT EMITTING DIODE PACKAGE

(71) Applicant: Advanced Optoelectronic Technology, Inc., Hsinchu Hsien (TW)

(72) Inventors: Hou-Te Lin, Hsinchu (TW); Pin-Chuan Chen, Hsinchu (TW); Lung-Hsin Chen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 14/014,424

(22) Filed: Aug. 30, 2013

(65) Prior Publication Data
US 2014/0175484 A1 Jun. 26, 2014

(30) Foreign Application Priority Data
Dec. 22, 2012 (CN) .......................... 2012 1 05618285

(51) Int. Cl.
*H01L 33/60* (2010.01)
*H01L 33/48* (2010.01)
*H01L 33/62* (2010.01)
*H01L 33/64* (2010.01)
*H01L 33/52* (2010.01)

(52) U.S. Cl.
CPC .............. *H01L 33/486* (2013.01); *H01L 33/60* (2013.01); *H01L 33/64* (2013.01); *H01L 33/48* (2013.01); *H01L 33/483* (2013.01); *H01L 33/52* (2013.01); *H01L 33/62* (2013.01); *H01L 33/642* (2013.01); *H01L 33/647* (2013.01); *H01L 2224/48091* (2013.01); *H01L 2924/0002* (2013.01)
USPC ................ 257/298; 257/81; 257/99; 257/100

(58) Field of Classification Search
CPC ......... H01L 33/52; H01L 33/60; H01L 33/62; H01L 33/64; H01L 33/48; H01L 33/483; H01L 33/486
USPC ........................................ 257/81, 98, 99, 100
See application file for complete search history.

(56) References Cited

U.S. PATENT DOCUMENTS

| | | | |
|---|---|---|---|
| 7,280,288 B2 * | 10/2007 | Loh et al. ...................... | 359/726 |
| 2006/0043401 A1 * | 3/2006 | Lee et al. ....................... | 257/99 |
| 2007/0120139 A1 * | 5/2007 | Ono ............................... | 257/99 |
| 2007/0262339 A1 * | 11/2007 | Hussell et al. ................. | 257/99 |
| 2008/0067535 A1 * | 3/2008 | Wu et al. ........................ | 257/98 |

(Continued)

FOREIGN PATENT DOCUMENTS

| | | |
|---|---|---|
| TW | 200537704 A | 11/2005 |
| TW | 201128812 A1 | 8/2011 |

*Primary Examiner* — Peniel M Gumedzoe
(74) *Attorney, Agent, or Firm* — Novak Druce Connolly Bove + Quigg LLP (57) ABSTRACT

An LED package includes a first electrode, a second electrode, a reflecting cup connecting the first electrode and the second electrode, and an LED chip. The first electrode includes a first main portion and a first connecting portion extending outwardly from the first main portion. The first connecting portion has a first connecting face away from the first main portion. The second electrode includes a second main portion and a second connecting portion extending outwardly from the second main portion. The second connecting portion has a second connecting face away from the second main portion. The first main portion and the second main portion are embedded into the receiving cup, and the first connecting face of the first connecting portion and the second connecting face of the second connecting portion are exposed outside the receiving cup.

6 Claims, 8 Drawing Sheets

(56) References Cited

U.S. PATENT DOCUMENTS

| | | | |
|---|---|---|---|
| 2009/0152665 A1* | 6/2009 | Tseng et al. | 257/461 |
| 2009/0315068 A1* | 12/2009 | Oshio et al. | 257/103 |
| 2010/0001306 A1* | 1/2010 | Park et al. | 257/99 |
| 2010/0019267 A1* | 1/2010 | Park et al. | 257/98 |
| 2011/0127566 A1 | 6/2011 | Yoon | |
| 2011/0210366 A1* | 9/2011 | Seo et al. | 257/98 |
| 2011/0220950 A1* | 9/2011 | Kim et al. | 257/98 |

* cited by examiner

LIGHT EMITTING DIODE PACKAGE

BACKGROUND

1. Technical Field

The present disclosure relates to semiconductor devices and, more particularly, to a light emitting diode (LED) package.

2. Description of Related Art

Presently, LEDs are preferred for use in non-emissive display devices than CCFLs (cold cathode fluorescent lamp) due to their high brightness, long lifespan, and wide color range.

A conventional LED package includes a substrate, an LED chip mounted on a top surface of the substrate, two electrodes electrically connected the LED chip and a reflector mounted on the top surface of the substrate and enclosing the LED chip therein. Accordingly, in many instances, for emitting light laterally, an LED chip is arranged on a side of an LED package. However, compared with a typical top-view LED package, a position of the LED chip needs to be changed, which results in a redesigning of a circuit connection and a space arrangement inside the LED package.

Accordingly, it is desirable to provide an improved LED package which can overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Embodiments of an LED package will now be described in detail below and with reference to the drawings.

Figure 1:
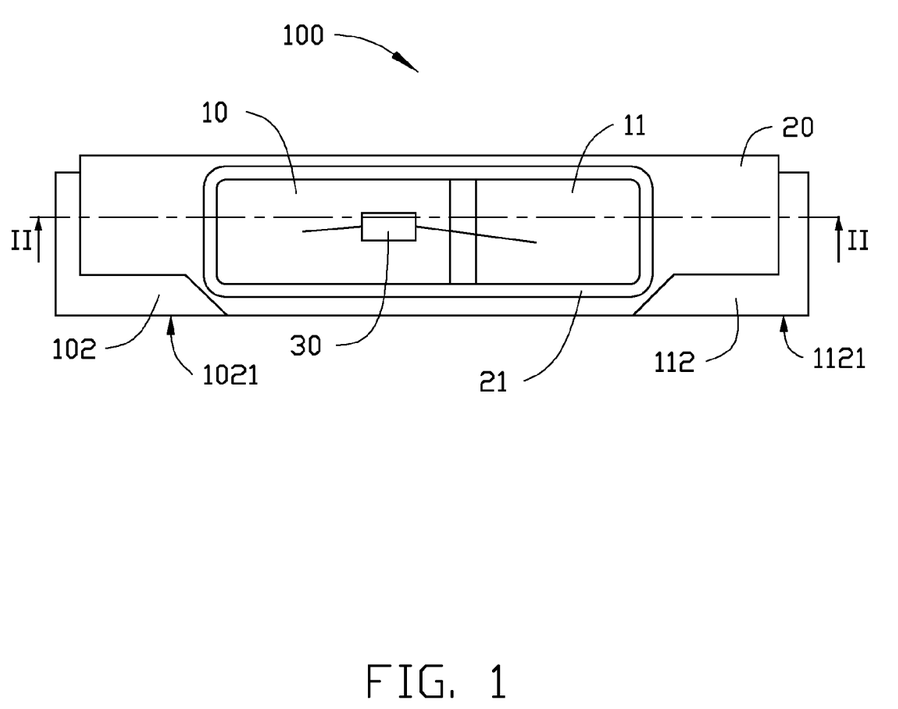
FIG. 1 is a schematic, top-side view of an LED package of a first embodiment of the present disclosure.
Figure 2:
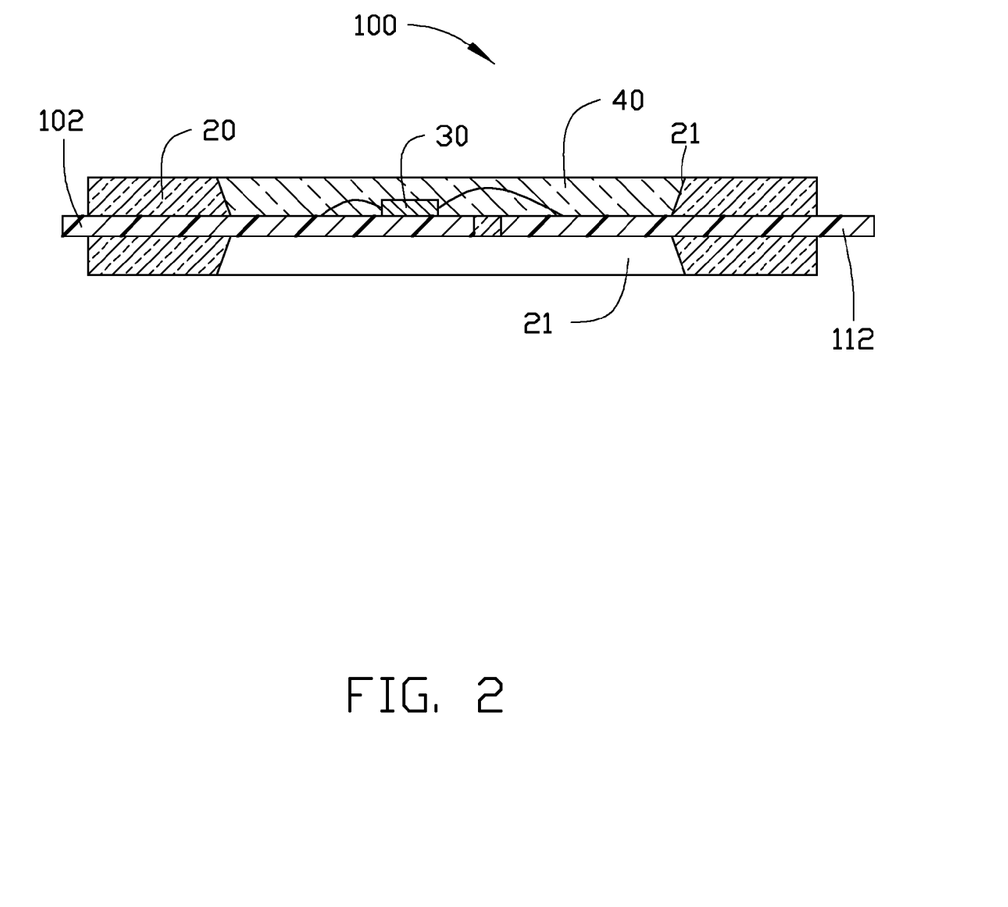
FIG. 2 is a cross sectional view of the LED package of FIG. 1, taken along a line II-II thereof.
Figure 3:
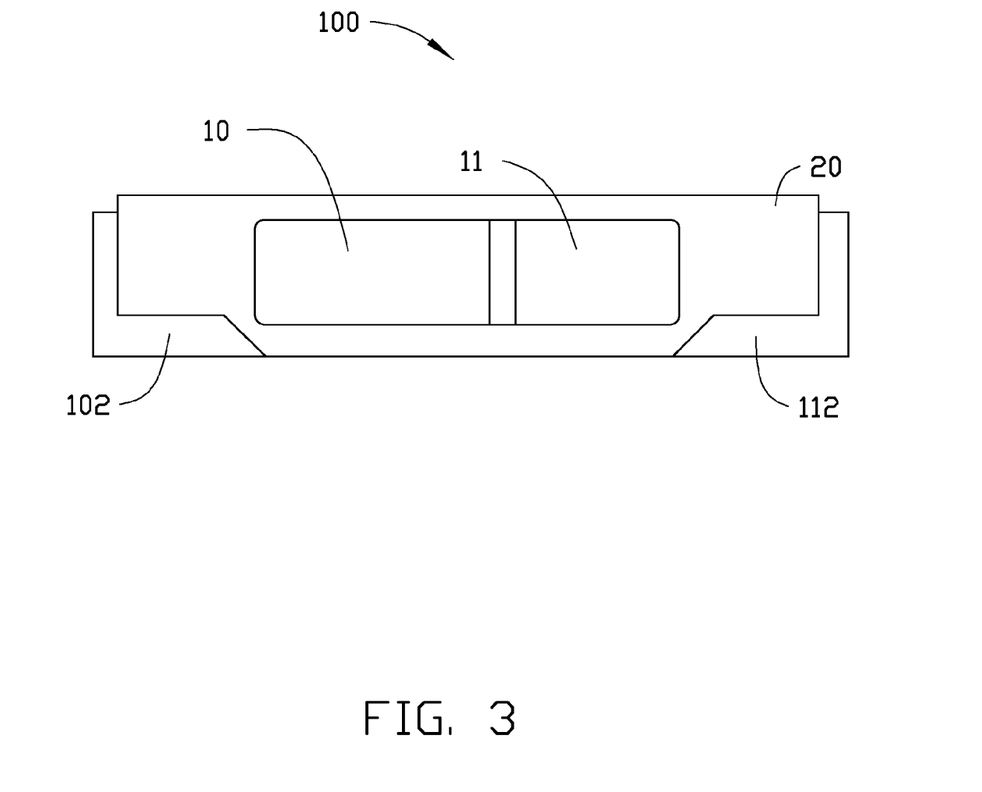
FIG. 3 is a bottom-side view of the LED package of FIG. 1.

Referring to FIGS. 1-3, an LED package 100 according to a first embodiment is shown. The LED package 100 includes a first electrode 10, a second electrode 11 spaced from the first electrode 10, a reflecting cup 20 having a receiving groove 21 and connecting the first electrode 10 and the second electrode 20, an LED chip 30 mounted in the receiving groove 21 of the reflecting cup 20 and electrically connecting the first electrode 10 and the second electrode 20, and an encapsulation layer 40 filled into the receiving groove 21 of the reflecting cup 20 and covering the LED chip 30.

Figure 4:
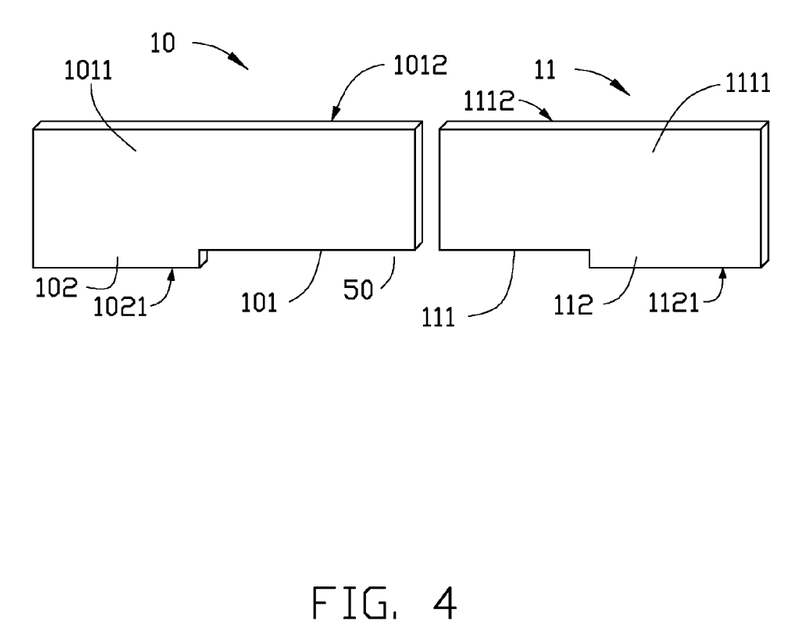
FIG. 4 shows a first electrode and a second electrode of the LED package of FIG. 1.
Figure 5:
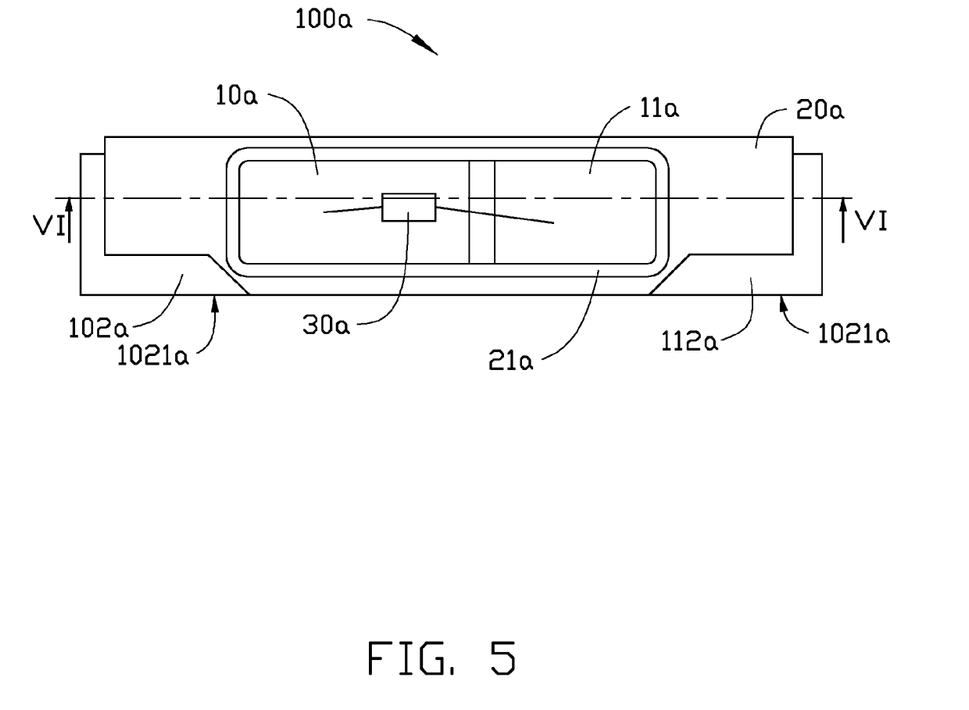
FIG. 5 is a schematic, top-side view of an LED package of a second embodiment of the present disclosure.

Referring to FIG. 4 also, the first electrode 10 is an elongated plate having a uniform thickness, and the second electrode 11 is an elongated plate having a uniform thickness. The first electrode 10 is L-shaped, and includes a rectangular first main portion 101 and a rectangular first connecting portion 102 extending perpendicularly from the first main portion 101. The second electrode 11 is L-shaped, and includes a rectangular second main portion 111 and a second connecting portion 112 extending perpendicularly from the second main portion 111. In this embodiment, the second connecting portion 112 is rectangular. In this embodiment, the first electrode 10 and the second electrode 11 are made of copper or chromium. A top face of the first electrode 10 is coplanar with a top face of the second electrode 11. A bottom face of the first electrode 10 is coplanar with a bottom face of the second electrode 11.

The first main portion 101 of the first electrode 10 and the second main portion 111 of the second electrode 11 are embedded into the reflecting cup 20. The first connecting portion 102 of the first electrode 10 and the second connecting portion 112 of the second electrode 11 extend outside of the reflecting cup 20 from two opposite lateral sides of the reflecting cup 20. The first connecting portion 102 has a first connecting face 1021 away from the first main portion 101. The second connecting portion 112 has a second connecting face 1121 away from the second main portion 111. The first connecting face 1021 and the second connecting face 1121 are both exposed outside of the reflecting cup 20. The first connecting face 1021 of the first connecting portion 102 is coplanar with the second connecting face 1121 of the second connecting portion 112.

The first main portion 101 has a first top face 1011 and a first bottom face 1012 opposite to the first top face 1011. The second main portion 111 has a second top face 1111 and a second bottom face 1112 opposite to the second top face 1111. The receiving groove 21 extends through the reflecting cup 20 along a bottom-to-top direction of the reflecting cup 20. The first top face 1011 and the first bottom face 1012 of the first main portion 101 are partially exposed in the receiving groove 21. The second top face 1111 and the second bottom face 1112 of the second main portion 111 are partially exposed in the receiving groove 21.

The reflecting cup 20 is made of silicone, epoxy resin or PMMA (polymethyl methacrylate). The reflecting cup 20 is annular, and is manufactured by injection molding or insert molding. When the reflecting cup 20 is manufactured, a mold for receiving a molding material is provided. The mold has a profile which is the same as that of the reflecting cup 20. A reflecting film (not shown) is further provided to coat on an inner surface of the receiving groove 21 to improve light outputting efficiency of the LED chip 30. The reflecting film is a metal film with a uniform thickness.

The LED chip 30 is received in the receiving groove 21 and electrically connects the first electrode 10 and the second electrode 11 by wires. The LED chip 30 is mounted on the first top face 1011 of the first main portion 101 of the first electrode 10. It could be understood that, the LED chip 30 can be directly fixed on the first electrode 10 or the second electrode 11 in a manner of Flip-Chip without wires.

It could be understood that, alternatively, the LED chip 30 can be mounted on the first bottom face 1012 of the first main portion 101 of the first electrode 10, and light emitted from the LED chip 30 projects downwardly.

The encapsulation layer 40 is made of transparent or translucent silicone, which fills the receiving groove 21. Thus, the encapsulation layer 40 encapsulates the LED chip 30 therein to protect the LED chip 30. To convert wavelength of light generated from the LED chip 30, a fluorescent material such as garnet, sulfides, phosphates, aluminates, oxynitrides, silicates, nitrides, arsenides or tellurides can be filled and scattered in the encapsulation layer 40.

A T-shaped gap 50 is formed between the first electrode 10 and the second electrode 11. The reflecting cup 20 is filled into the gap 50, whereby the first electrode 10 and the second electrode 11 tightly and fitly engage with the reflecting cup 20.

Referring to FIGS. 5-8, an LED package 100a according to a second embodiment is shown. The LED package 100a includes a first electrode 10a, a second electrode 11a spaced from the first electrode 10a, a reflecting cup 20a having a receiving groove 21a and connecting the first electrode 10a and the second electrode 20a, an LED chip 30a received in the receiving groove 21a of the reflecting cup 20a and electrically connecting the first electrode 10a and the second electrode 20a, and an encapsulation layer 40a filled in the receiving groove 21a of the reflecting cup 20a and covering the LED chip 30a.

Figure 8:
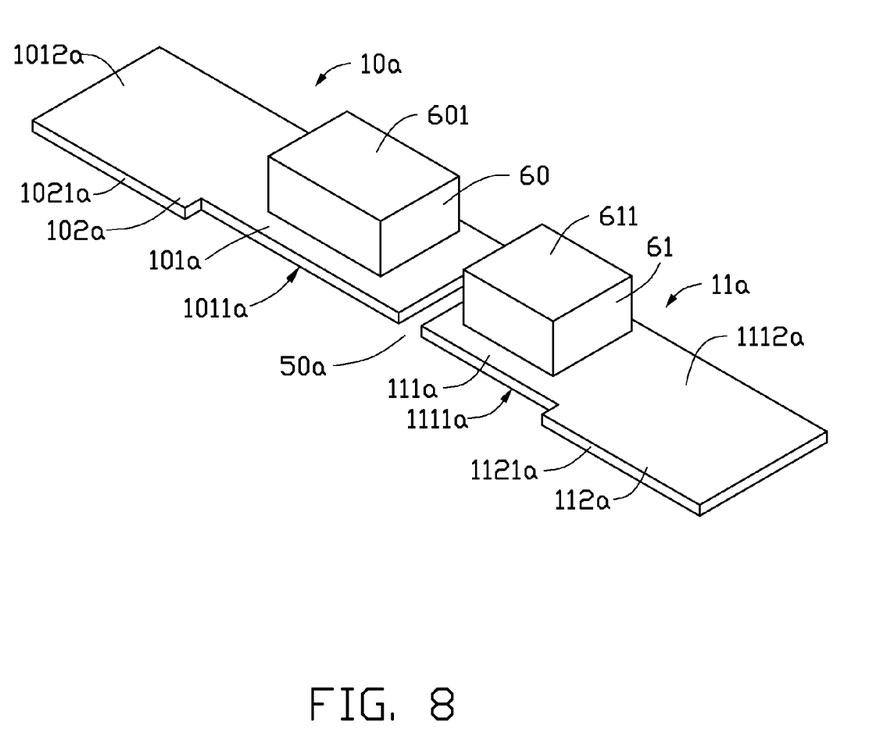
FIG. 8 shows a first electrode and a second electrode of the LED package of FIG. 5.

The first electrode 10a includes a rectangular first main portion 101a, a rectangular first connecting portion 102a extending perpendicularly from a lateral side of the first main portion 101a, and a first block 60 extending downwardly from a bottom of the first main portion 101a. The second electrode 11a includes a rectangular second main portion 111a, a rectangular second connecting portion 112a extending perpendicularly from a lateral side of the second main portion 111a, and a second block 61 extending downwardly from a bottom of the second main portion 111a. In this embodiment, the first electrode 10a and the second electrode 11a are made of copper or chromium. A top face of the first electrode 10a is coplanar with a top face of the second electrode 11a.

The first main portion 101a of the first electrode 10a and the second main portion 111a of the second electrode 11a are embedded into the reflecting cup 20a. The first connecting portion 102a of the first electrode 10a and the second connecting portion 112a of the second electrode 11a extend outside of the reflecting cup 20a from two opposite lateral sides of the reflecting cup 20a. The first connecting portion 102a has a first connecting face 1021a away from the first main portion 101a. The second connecting portion 112a has a second connecting face 1121a away from the second main portion 111a. The first connecting face 1021a and the second connecting face 1121a are both exposed outside of the reflecting cup 20a. The first connecting face 1021a of the first connecting portion 102a is coplanar with the second connecting face 1121a of the second connecting portion 112a.

Figure 6:
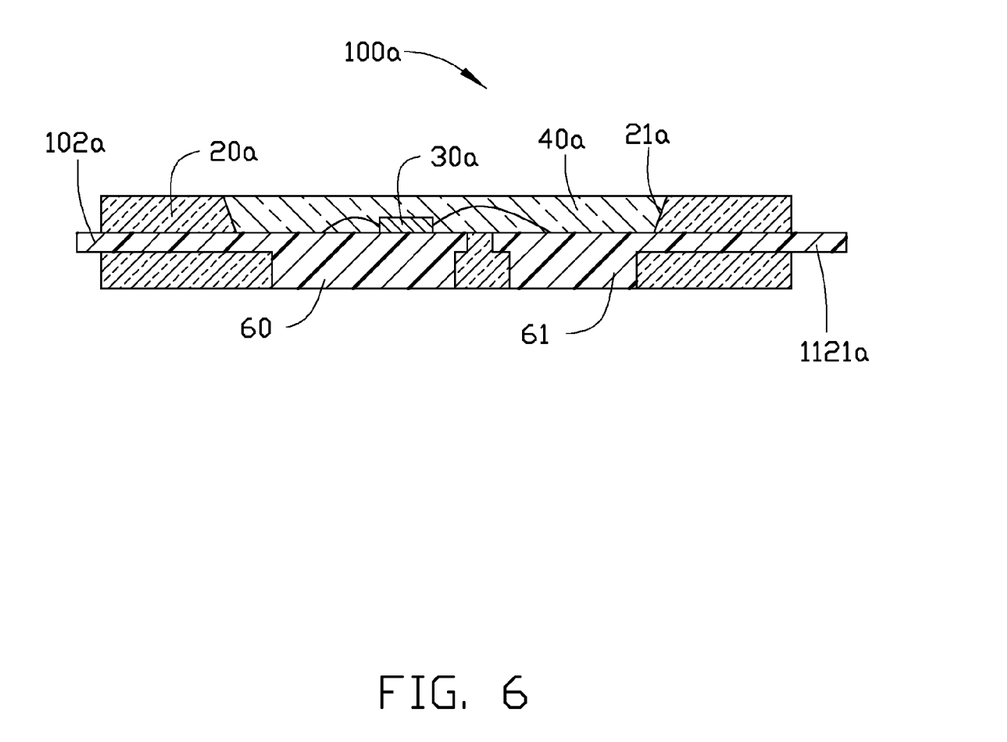
FIG. 6 is a cross sectional view of the LED package of FIG. 5, taken along a line VI-VI thereof.

The first main portion 101a has a first top face 1011a and a first bottom face 1012a opposite to the first top face 1011a. The second main portion 111a has a second top face 1111a and a second bottom face 1112a opposite to the second top face 1111a. The receiving groove 21a is recessed inwardly from a center of a top of the reflecting cup 20a along a top-to-bottom direction of the reflecting cup 20a. The first top face 1011a of the first main portion 101a and the second top face 1111a of the second main portion 111a are partially exposed in the receiving groove 21a.

Figure 7:
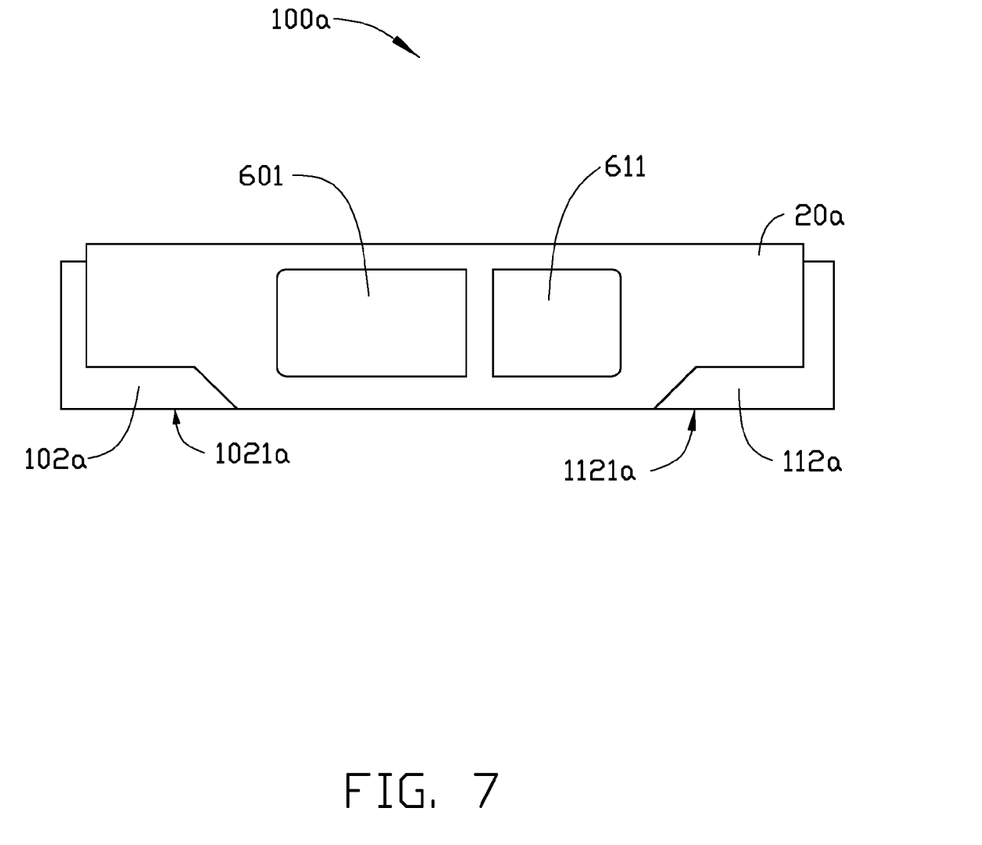
FIG. 7 is a bottom-side view of the LED package of FIG. 5.

The first block 60 extends downwardly from a first bottom face 1012a of the first main portion 101a, and through the reflecting cup 20a. A bottom surface 601 of the first block 60 is exposed outside the reflecting cup 20a. The second block 61 extends downwardly from a second bottom face 1112a of the second main portion 111a, and through the reflecting cup 20a. A bottom surface 611 of the second block 61 is exposed outside the reflecting cup 20a. The bottom surface 601 of the first block 60 is coplanar with the bottom surface 611 of the second block 61. The first block 60 is located adjacent to the second block 61.

The reflecting cup 20a is made of silicone, epoxy resin or PMMA (polymethyl methacrylate). The reflecting cup 20a is annular, and is manufactured by injection molding or insert molding. When the reflecting cup 20a is manufactured, a mold for receiving a molding material is provided. The mold has a profile which is the same as that of the reflecting cup 20a.

The LED chip 30a is received in the receiving groove 21a and electrically connects the first electrode 10a and the second electrode 11a by wires. The LED chip 30a is mounted on the first top face 1011a of the first main portion 101a of the first electrode 10a. It could be understood that, the LED chip 30a can be directly fixed on the first electrode 10a or the second electrode 11a in a manner of Flip-Chip without wires.

The encapsulation layer 40a is made of transparent or translucent silicone, which fills in the receiving groove 21a. Thus, the encapsulation layer 40a encapsulates the LED chip 30a therein to protect the LED chip 30a. To convert wavelength of light generated from the LED chip 30a, a fluorescent material such as garnet, sulfides, phosphates, aluminates, oxynitrides, silicates, nitrides, arsenides or tellurides can be filled and scattered in the encapsulation layer 40a.

A gap 50a is formed between the first electrode 10a and the second electrode 11a. The reflecting cup 20a is filled into the gap 50a, whereby the first electrode 10a and the second electrode 11a tightly and fitly engage with the reflecting cup 20a.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A LED (light emitting diode) package, comprising:
a first electrode, the first electrode comprising a first main portion and a first connecting portion extending outwardly from the first main portion, and the first connecting portion having a first connecting face away from the first main portion;
a second electrode electrically insulated from the first electrode, the second electrode comprising a second main portion and a second connecting portion extending outwardly from the second main portion, and the second connecting portion having a second connecting face away from the second main portion;
a reflecting cup having a receiving groove and connecting the first electrode and the second electrode; and
an LED chip received in the receiving groove and electrically connecting the first electrode and the second electrode;
wherein the first main portion of the first electrode and the second main portion of the second electrode are embedded into the reflecting cup, and the first connecting face of the first connecting portion and the second connecting face of the second connecting portion are exposed outside the receiving cup;
wherein the first main portion has a first top face and a first bottom face opposite to the first top face, the second main portion has a second top face and a second bottom face opposite to the second top face, and the receiving groove extends through a center of the reflecting cup along a bottom-to-top direction of the reflecting cup;
wherein the LED chip is attached to one of the first top face of the first main body and the second top face of the second main body, and an encapsulation layer is only filled into an upper portion of the receiving groove located above the first top face of the first main body and the second top face of the second main body and covering the LED chip; and wherein the first bottom face of the first main body and the second bottom face of the second main body are partially exposed through the receiving groove.

2. The LED package of claim 1, wherein the first electrode and the second electrode are L-shaped, the first connecting portion is perpendicular to the first main portion, and the second connecting portion is perpendicular to the second main portion.

3. The LED package of claim 2, wherein the first connecting face of the first connecting portion is coplanar with the second connecting face of the second connecting portion.

4. The LED package of claim 1, wherein the first electrode and the second electrode extend outwardly from two opposite lateral sides of the reflecting cup, respectively.

5. The LED package of claim 1, wherein a gap is formed between the first electrode and the second electrode, and the reflecting cup is filled into the gap.

6. The LED package of claim 1, wherein the first electrode is an elongated plate with a uniform thickness, and the second electrode is an elongated plate with a uniform thickness.

* * * * *